United States Patent
Ishida et al.

(10) Patent No.: US 6,933,542 B2
(45) Date of Patent: Aug. 23, 2005

(54) FIELD-EFFECT TRANSISTOR, AND INTEGRATED CIRCUIT DEVICE AND SWITCHING CIRCUIT USING THE SAME

(75) Inventors: Hidetoshi Ishida, Kyoto (JP); Tsuyoshi Tanaka, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 18 days.

(21) Appl. No.: 10/768,040

(22) Filed: Feb. 2, 2004

(65) Prior Publication Data

US 2004/0188724 A1 Sep. 30, 2004

(30) Foreign Application Priority Data

Feb. 10, 2003 (JP) ......................................... 2003-032038

(51) Int. Cl.$^7$ ...................... H01L 31/109; H01L 29/739
(52) U.S. Cl. ...................... 257/192; 257/190
(58) Field of Search ........................... 257/190, 192, 257/194, 20

(56) References Cited

U.S. PATENT DOCUMENTS

| | | |
|---|---|---|
| 5,952,672 A | 9/1999 | Kikkawa |
| 6,294,802 B1 | 9/2001 | Unozawa |

FOREIGN PATENT DOCUMENTS

| | | |
|---|---|---|
| JP | 63-228763 | 9/1988 |
| JP | 11-243058 | 9/1999 |
| JP | P2000-31467 A | 1/2000 |
| JP | 2003-68764 * | 3/2003 |

* cited by examiner

*Primary Examiner*—Ngân V. Ngô
(74) *Attorney, Agent, or Firm*—McDermott Will & Emery LLP (57) ABSTRACT

A channel layer made of undoped InGaAs, a carrier supply layer made of n-type AlGaAs, a Schottky layer made of disordered InGaP without a natural superlattice structure, and a cap layer made of GaAs are successively stacked on a compound semiconductor substrate. A gate electrode is formed on a part of the Schottky layer exposed at the opening of the cap layer. Source and drain electrodes are formed on the cap layer. The thickness of the Schottky layer is set at about 8 nm or less. As a result, the reverse breakdown voltage of the gate electrode becomes larger than that in the case of a Schottky layer made of AlGaAs.

9 Claims, 7 Drawing Sheets

PRIOR ART

FIELD-EFFECT TRANSISTOR, AND INTEGRATED CIRCUIT DEVICE AND SWITCHING CIRCUIT USING THE SAME

BACKGROUND OF THE INVENTION (1) Field of the Invention

The present invention relates to a field-effect transistor, and an integrated circuit device and a switching circuit using the same, and more particularly relates to a field-effect transistor used for radio frequency communications equipment or a switching circuit.

(2) Description of Related Art

In radio frequency communications equipment typified by cellular phones, there have been widely used Modulation Doped Field Effect Transistors (MODFET) using an electron supply layer doped with n-type impurities on an undoped channel layer.

Conventionally, indium gallium arsenide (InGaAs) with high electron mobility has been used for channel layers of MODFETs, and aluminum gallium arsenide (AlGaAs) having a larger band gap than InGaAs for electron supply layers.

However, the use of AlGaAs with a high interface state density makes it difficult to increase the current density of a MODFET, due to the trapping of electrons in an interface state. More specifically, an interface state is formed on the surface of an electron supply layer and serves as a trap for trapping electrons and holding them on the surface of the electron supply layer. The negative electric charge of the electrons trapped in this trap narrows a depletion layer in a channel region. A so-called frequency dispersion of drain current is caused in which such a depletion-layer-narrowing phenomenon significantly decreases the maximum current density in the application of an RF signal to a gate as compared with that in the application of a direct current thereto.

To cope with such a problem, indium gallium phosphide (InGaP), instead of AlGaAs, is used as a material constituting an electron supply layer, thereby decreasing traps produced in the electron supply layer. This can provide increased current density of a field-effect transistor (for example, see Japanese Laid-Open Patent Application Publication No. 63-228763).

Figure 7:
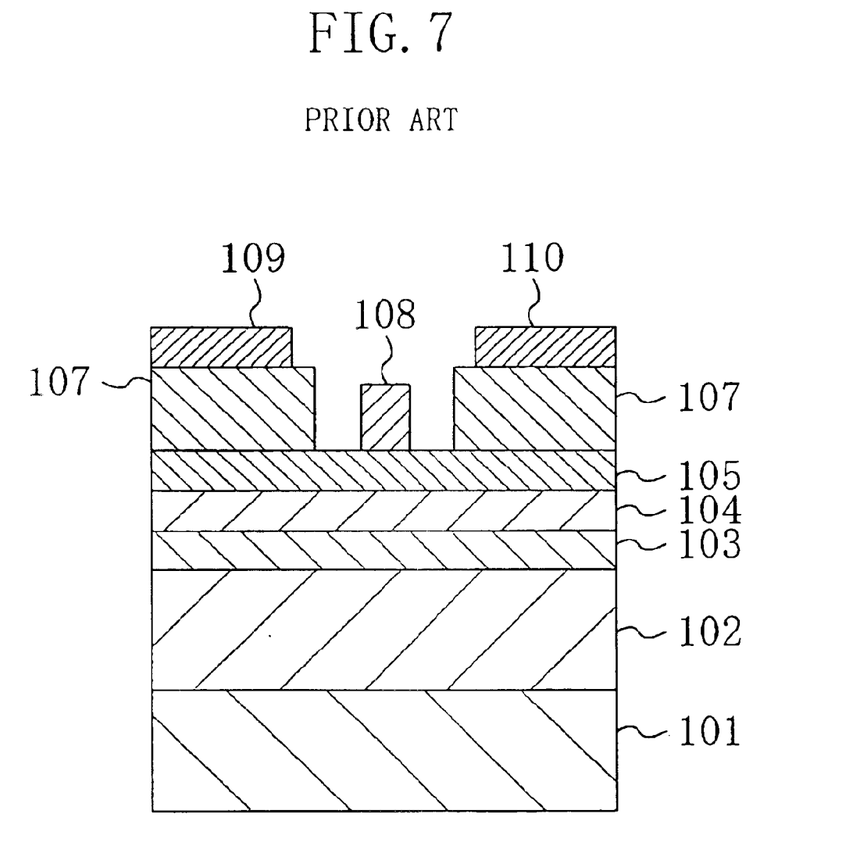
FIG. 7 is a structural cross sectional view showing a known field-effect transistor.

FIG. 7 shows the cross sectional structure of a known MODFET using InGaP for an electron supply layer. As shown in FIG. 7, a buffer layer 102 made of undoped GaAs, an n-type-impurity-doped barrier layer 103 made of AlGaAs, a channel layer 104 made of undoped $In_{0.2}Ga_{0.8}As$, an n-type-impurity-doped electron supply layer 105 made of InGaP, and an n-type-impurity-doped cap layer 107 of GaAs having an opening formed to expose the electron supply layer 105 are successively stacked on a compound semiconductor substrate 101 made of GaAs. On the electron supply layer 105 exposed at the opening of the cap layer 107, a gate electrode 108 is formed by a Schottky junction. Source and drain electrodes 109 and 110 are formed on the cap layer 107.

InGaP is a material with a lower interface state density than AlGaAs. Thus, the interface state level of the electron supply layer 105 exposed at the opening of the cap layer 107 can be reduced. This can enhance the maximum current density in the application of an RF signal.

By the way, when a semiconductor layer of InGaP (InGaP layer) in a known MODFET is crystal-grown through a commonly used compound semiconductor fabrication method, a natural superlattice is formed in which Ga atoms and In atoms are alternately placed in the same plane in Group-III atomic layers.

In recent years, a method for forming an InGaP layer by breaking a natural superlattice structure to disorder the arrangement of Ga atoms and In atoms in the Group III atomic layers has been known, for example, as described in Japanese Laid-Open Patent Application Publication No. 11-243058. Field-effect transistors have been developed in which such InGaP with a broken natural superlattice is used to reduce the interface resistance between an InGaP layer and the adjacent semiconductor layers.

However, it has experimentally been known that the known MODFET above has a lower reverse breakdown voltage of the gate electrode 108 to the drain electrode 110 than that using AlGaAs for the electron supply layer 105. The reason for this is that in the known MODFET, the gate electrode 108 is formed by a Schottky junction with the electron supply layer 105 made of InGaP.

In this way, when in the known MODFET InGaP is used to enhance the maximum current density in the application of the RF signal, the material constraints of InGaP reduce the gate breakdown voltage. Therefore, it is difficult to improve both the maximum current density and the gate breakdown voltage.

SUMMARY OF THE INVENTION

The present invention is made to solve the above conventional problems, and an object of the present invention is to provide a field-effect transistor that can improve both the maximum current density and the gate breakdown voltage.

In order to attain the above object, the present invention provides, in the upper part of a Schottky layer, an InGaP layer having a broken natural superlattice and a thickness of a predetermined value or less.

More specifically, a field-effect transistor of the present invention comprises: a first compound semiconductor layer (channel layer) through which carriers travel; a second compound semiconductor layer (carrier supply layer) for supplying carriers to the first compound semiconductor layer, said second compound semiconductor layer being formed on the first compound semiconductor layer; a third compound semiconductor layer (Schottky layer) formed on the second compound semiconductor layer; and a gate electrode forming a Schottky junction with the third compound semiconductor layer, said gate electrode being formed on the third compound semiconductor layer, wherein at least the upper part of the third compound semiconductor layer is made of indium gallium phosphate having a broken natural superlattice and a set thickness of a predetermined value or less.

According to the field-effect transistor of the present invention, at least the upper part of the third compound semiconductor layer is made of indium gallium phosphate (InGaP) having the broken natural superlattice. Therefore, the maximum current density can be improved by reducing the interface state density in the third compound semiconductor layer. Furthermore, since indium gallium phosphate placed in the third compound semiconductor layer is set to have a thickness of a predetermined value or less, the breakdown voltage of the gate electrode is improved. This is based on the present inventors' following finding: when indium gallium phosphate with a broken natural superlattice structure is used for the upper part of the third compound semiconductor layer, the breakdown voltage of the gate electrode tends to initially rapidly increase and then gradually decrease, with the increase in indium gallium phosphate thickness from the state where indium gallium phosphate with a broken natural superlattice structure is not placed in the upper part of the third compound semiconductor layer. Hence, indium gallium phosphate with a broken natural superlattice structure, placed in the upper part of the third compound semiconductor layer, is set to have a thickness of a predetermined value or less. As a result, the breakdown voltage of the gate electrode becomes larger than that in the case where indium gallium phosphate with a broken natural superlattice structure is not formed in the upper part of the third compound semiconductor layer.

According to the field-effect transistor of the present invention, indium gallium phosphate placed in the third compound semiconductor layer preferably has a thickness of 8 nm or less. This certainly increases the breakdown voltage of the gate electrode as compared with the structure of a field-effect transistor containing no indium gallium phosphate in the third compound semiconductor layer.

According to the field-effect transistor of the present invention, when the indium gallium phosphate is placed only in the upper part of the third compound semiconductor layer, the lower part of the third compound semiconductor layer is preferably made of aluminum gallium arsenide.

According to the field-effect transistor of the present invention, the second compound semiconductor layer is preferably made of aluminum gallium arsenide.

Preferably, the field-effect transistor of the present invention further comprises a protective film made of a low-dielectric-constant material, said protective film being formed to cover the gate electrode on the third compound semiconductor layer. This allows the third compound semiconductor layer and the gate electrode to be covered with the low-dielectric-constant protective film. Therefore, the parasitic capacitance of the gate electrode can be reduced. Furthermore, since at least the upper part of the third compound semiconductor layer is made of InGaP that is a hard-to-oxidize material, the reliability does not decrease even using the low-dielectric-constant material.

According to the field-effect transistor of the present invention, the low-dielectric-constant material is preferably benzocyclobutene.

An integrated circuit device of the present invention may be obtained by forming, on a substrate, a field-effect transistor and passive element electrically connected to the field-effect transistor. The field-effect transistor may comprise: a first compound semiconductor layer through which carriers travel; a second compound semiconductor layer for supplying carriers to the first compound semiconductor layer, said second compound semiconductor layer being formed on the first compound semiconductor layer; a third compound semiconductor layer formed on the second compound semiconductor layer; and a gate electrode forming a Schottky junction with the third compound semiconductor layer, said gate electrode being formed on the third compound semiconductor layer. At least the upper part of the third compound semiconductor layer may be made of indium gallium phosphate having a broken natural superlattice and a set thickness of a predetermined value or less.

According to the integrated circuit device of the present invention, the field-effect transistor of the present invention is used as a field-effect transistor of the integrated circuit device and is integrated with the passive element on a single substrate. Consequently, the field-effect transistor can simultaneously improve both the maximum current density and the breakdown voltage of the gate electrode. Therefore, circuit characteristics can dramatically be improved.

A first switching circuit of the present invention may comprise a field-effect transistor including gate, drain and source electrodes, said drain and source electrodes serving as input and output terminals, and a resistive element connected at one end to the gate electrode and serving as a control terminal at the other end. The field-effect transistor may comprise: a first compound semiconductor layer through which carriers travel; a second compound semiconductor layer for supplying carriers to the first compound semiconductor layer, said second compound semiconductor layer being formed on the first compound semiconductor layer; a third compound semiconductor layer formed on the second compound semiconductor layer; and a gate electrode forming a Schottky junction with the third compound semiconductor layer, said gate electrode being formed on the third compound semiconductor layer. At least the upper part of the third compound semiconductor layer may be made of indium gallium phosphate having a broken natural superlattice and a set thickness of a predetermined value or less.

A plurality of second switching circuits of the present invention each comprises: a field-effect transistor including gate, drain and source electrodes, said drain and source electrodes serving as input and output terminals; and a resistive element connected at one end to the gate electrode and serving as a control terminal at the other end, said plurality of switching circuits being electrically connected to one another. Each field-effect transistor may comprise: a first compound semiconductor layer through which carriers travel; a second compound semiconductor layer for supplying carriers to the first compound semiconductor layer, said second compound semiconductor layer being formed on the first compound semiconductor layer; a third compound semiconductor layer formed on the second compound semiconductor layer; and a gate electrode forming a Schottky junction with the third compound semiconductor layer, said gate electrode being formed on the third compound semiconductor layer. At least the upper part of the third compound semiconductor layer may be made of indium gallium phosphate with a broken natural superlattice and a set thickness of a predetermined value or less.

According to the first and second switching circuits, the use of the field-effect transistor of the present invention prevents the failure (burst failure) to disenable adequate switching from an off state to an on state. Therefore, excellent switching characteristics can be obtained.

DETAILED DESCRIPTION OF THE INVENTION (Embodiment 1)

A first embodiment of the present invention will be described with reference to the drawings.

Figure 1:
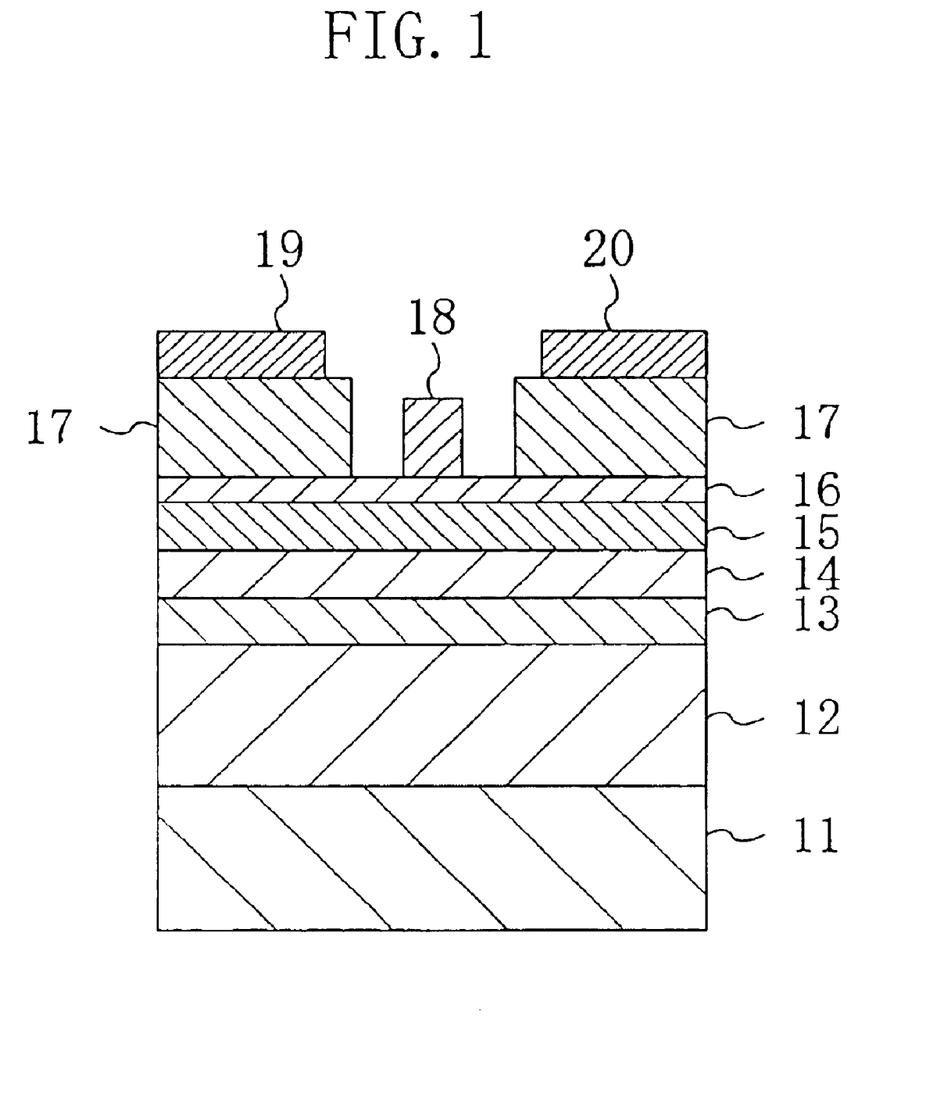
FIG. 1 is a structural cross sectional view showing a field-effect transistor according to a first embodiment of the present invention.

FIG. 1 is a structural cross sectional view showing a field-effect transistor according to a first embodiment of the present invention. As shown in FIG. 1, an approximately 500 nm-thick buffer layer 12 made of aluminum gallium arsenide (AlGaAs), an approximately 100 nm-thick barrier layer 13 made of n-type AlGaAs, an approximately 15 nm-thick channel layer 14 made of undoped indium gallium arsenide (InGaAs), an approximately 20 nm-thick carrier supply layer 15 made of n-type AlGaAs, an approximately 5 nm-thick Schottky layer 16 made of undoped indium gallium phosphate (InGaP) with a broken natural superlattice, an approximately 100 nm-thick cap layer 17 made of n-type-impurity-doped GaAs and having an opening at which the Schottky layer 16 is partly exposed are sequentially stacked, for example, on a compound semiconductor substrate 11 made of gallium arsenide (GaAs).

In this case, InGaP with a broken natural superlattice represents InGaP having a crystal structure in which Ga atoms and In atoms are irregularly ordered in the Group III atomic layers.

Typically the formation of an InGaP layer through crystal growth leads to the formation of a natural superlattice in which Ga layers and In layers are alternately ordered in the Group III atomic layers. However, the crystal growth of an InGaP layer at a low temperature leads to the formation of an InGaP layer with a broken natural superlattice. Such InGaP with a broken natural superlattice will hereinafter be referred to as disordered InGaP.

A gate electrode 18 is formed of a layered film (Ti/Al) of titanium and aluminum on a part of the Schottky layer 16 exposed at the opening of the cap layer 17 to form a Schottky junction with the Schottky layer 16. Source and drain electrodes 19 and 20 of a gold germanium (AuGe) based alloy are both formed as ohmic electrodes on the cap layer 17.

A material constituting the gate electrode 18 is not limited to Ti/Al but need only be a material forming a Shottky junction with the Schottky layer 16. For example, a layered film (Ti/Pt/Au) obtained by stacking titanium, platinum and gold, or tungsten silicide (WSi) can be employed.

Furthermore, a material constituting the cap layer 17 is not limited to GaAs. For example, InGaAs may be employed. When InGaAs is used as the material constituting the cap layer 17, Ti/Pt/Au, instead of an AuGe based alloy, can be used as a material constituting the source and drain electrodes 19 and 20.

In the specific composition of each semiconductor layer according to the field-effect transistor of the first embodiment, for example, $In_{0.2}Ga_{0.8}As$ is used as InGaAs constituting the channel layer 14, $Al_{0.2}Ga_{0.8}As$ is used as AlGaAs constituting the carrier supply layer 15, and $In_{0.5}Ga_{0.5}P$ is used as InGaP constituting the Schottky layer 16. The carrier supply layer 15 is planar-doped with silicon (Si) at a doping concentration of about $4\times10^{12}cm^{-3}$.

In the first embodiment, the whole Schottky layer 16 with a thickness of 5 nm is composed of disordered InGaP but it is not restrictive. For example, when the disordered InGaP thickness is set at 3 nm, the remaining 2 nm of the Schottky layer 16 is formed of AlGaAs. On the other hand, when the disordered InGaP thickness is set at 7 nm, the thickness of the carrier supply layer 15 needs to be reduced by 2 nm such that the distance between the channel layer 14 and the gate electrode 18 is not changed. This distance serves as a parameter for determining the threshold voltage $V_{th}$ of the transistor.

In the field-effect transistor according to the first embodiment, the Schottky layer 16 made of InGaP is placed on the carrier supply layer 15 made of AlGaAs. This reduces the interface state density of the Schottky layer 16, leading to suppressed frequency dispersion. As a result, a high maximum current density can be achieved even in the application of an RF signal to the gate electrode 18.

Furthermore, the first embodiment is characterized in that disordered InGaP is formed as the upper part of the Schottky layer 16 to have a thickness of more than 0 nm but not more than 10 nm, 5 nm in this case. Thus, the reverse breakdown voltage of the gate electrode 18 can be enhanced. In this case, the reverse breakdown voltage of the gate electrode 18 represents breakdown voltage against negative voltage applied to the gate electrode 18 between the gate electrode 18 and the drain electrode 20.

The relationship between the thickness of the Schottky layer 16 and the reverse breakdown voltage of the gate electrode 18 will be described hereinafter with reference to the drawing.

Figure 2:
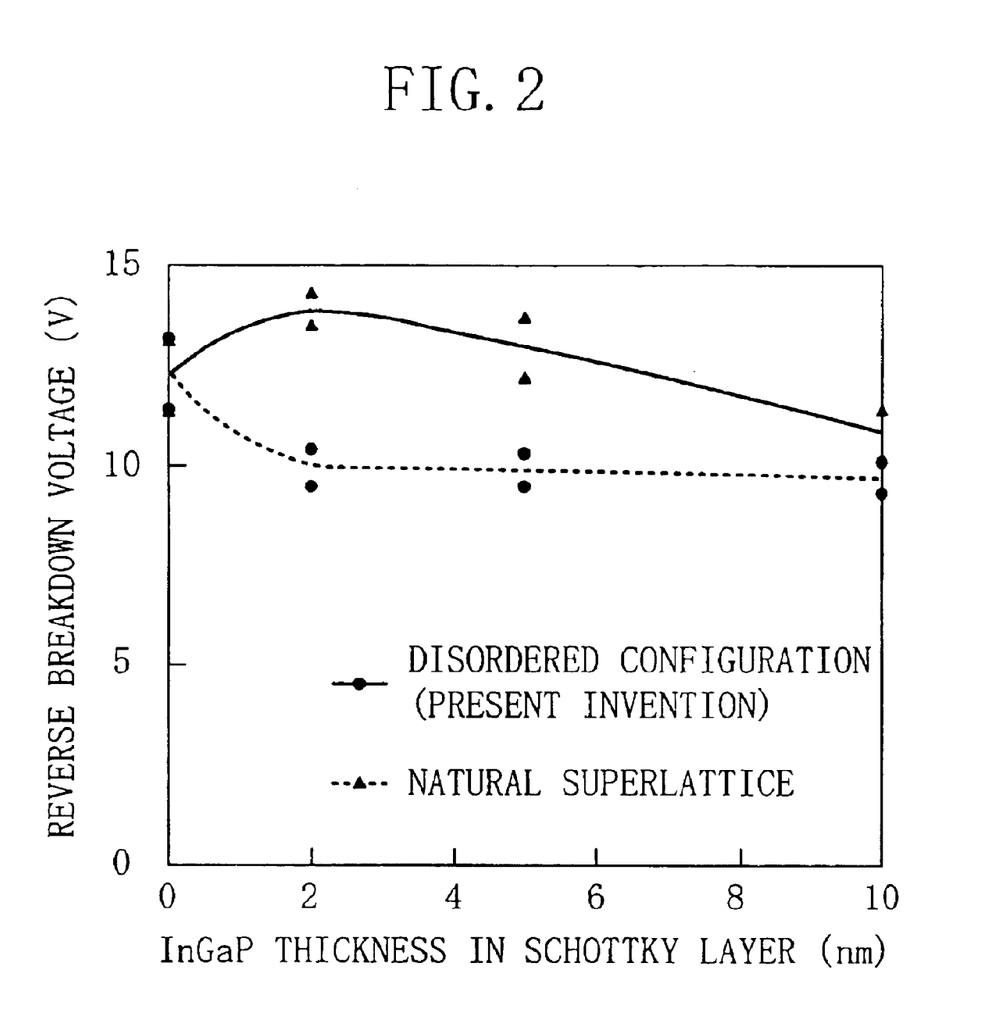
FIG. 2 is a graph showing the relationship between the thickness of a Schottky layer and gate breakdown voltage in the field-effect transistor.

FIG. 2 experimentally shows the relationship between the thickness of InGaP placed in the upper part of the Schottky layer 16 and the reverse breakdown voltage of the gate electrode 18 in the field-effect transistor according to the first embodiment. In FIG. 2, the axis of abscissas represents the thickness of InGaP placed in the upper part of the Schottky layer 16, while the axis of ordinates represents the reverse breakdown voltage of the gate electrode 18. In this case, when the InGaP thickness in the Schottky layer 16 is 0 nm, the Schottky layer 16 is made of an AlGaAs bulk. When the InGaP thickness therein is 10 nm, 10 nm-thick InGaP is placed in the upper part of the Schottky layer 16 and the remainder thereof is made of AlGaAs. The solid line represents the field-effect transistor of the first embodiment using disordered InGaP as InGaP placed in the upper part of the Schottky layer 16. The broken line is shown for comparison and represents the case where InGaP with a natural superlattice structure is used as InGaP placed in the upper part of the Schottky layer 16.

As shown in FIG. 2, when the thickness of InGaP placed in the upper part of the Schottky layer 16 is 0 nm, i.e., when the Schottky layer 16 is entirely formed of AlGaAs, the reverse breakdown voltage is about 12V.

As shown by the solid line in FIG. 2, in the transistor structure of the first embodiment including disordered InGaP in the upper part of the Schottky layer 16, if the InGaP thickness in the Schottky layer 16 increases to about 2 nm, the reverse breakdown voltage rapidly increases. Thereafter, the reverse breakdown voltage is gradually reduced with the increase in InGaP thickness. If the InGaP thickness is larger than about 8 nm, the reverse breakdown voltage becomes smaller than about 12V.

On the other hand, as shown by the broken line in FIG. 2, if InGaP with a natural superlattice structure is placed in the upper part of the Schottky layer 16 and increases in thickness to about 2 nm, the reverse breakdown voltage rapidly deceases. Thereafter, the reverse breakdown voltage hardly changes despite the increase in the thickness of the InGaP with a natural superlattice.

As apparent from FIG. 2, in the first embodiment in which disordered InGaP is placed in the upper part of the Schottky layer 16, the disordered InGaP has a thickness that increases the reverse breakdown voltage of the gate electrode 18 as compared with the case where the gate electrode 18 is formed on the Schottky layer 16 made of AlGaAs. More specifically, when the thickness of disordered InGaP placed in the upper part of the Schottky layer 16 is 10 nm or less and more preferably 8 mn or less, the reverse breakdown voltage increases as compared with the case where the gate electrode 18 is formed on the Schottky layer 16 made of AlGaAs.

On the other hand, when InGaP with a natural superlattice structure is placed in the upper part of the Schottky layer 16, the reverse breakdown voltage does not increase as compared with the case where the gate electrode 18 is formed on the Schottky layer 16 made of AlGaAs.

In this way, when disordered InGaP with a thickness of more than 0 nm but not more than 8 nm is placed in the upper part of the Schottky layer 16, the reverse breakdown voltage becomes larger than that in the case where the gate electrode 18 is formed on the Schottky layer 16 made of AlGaAs.

In the first embodiment, a description was given of the case where $Al_{0.2}Ga_{0.8}As$ is used as AlGaAs constituting the carrier supply layer 15 and $In_{0.5}Ga_{0.5}P$ is used as InGaP placed in the upper part of the Schottky layer 16. However, even when the composition and impurity concentration of each semiconductor layer are changed, the disordered InGaP thickness can be set such that the reverse breakdown voltage of the gate electrode 18 becomes larger than that in the case where the gate electrode 18 is formed on the Schottky layer 16 made of AlGaAs.

More particularly, even when the composition and impurity concentration of each semiconductor layer are changed, the reverse breakdown voltage of the gate electrode 18 tends to initially rapidly increase and then gradually decrease, with the increase in the thickness of InGaP placed in the upper part of the Schottky layer 16. That is, when the thickness of InGaP placed in the upper part of the Schottky layer 16 is larger than a predetermined value, the reverse breakdown voltage becomes smaller than that in the case where InGaP is not placed therein. Therefore, the thickness of InGaP placed in the upper part of the Schottky layer 16 is set at a predetermined value, i.e., the thickness allowing the reverse breakdown voltage to be the same as that in the case where InGaP is not placed in the upper part of the Schottky layer 16, or less. As a result, the reverse breakdown voltage of the gate electrode 18 becomes larger than that in the case where the gate electrode 18 is formed on the Schottky layer 16 made of AlGaAs.

As described above, according to the first embodiment, disordered InGaP with a broken natural superlattice is placed at least in the upper part of the Schottky layer 16 and then the InGaP layer thickness is set at a predetermined value or less. As a result, it becomes possible to improve both the maximum current density and the reverse breakdown voltage.

(Embodiment 2)

A second embodiment of the present invention will be described hereinafter with reference to the drawing.

Figure 3:
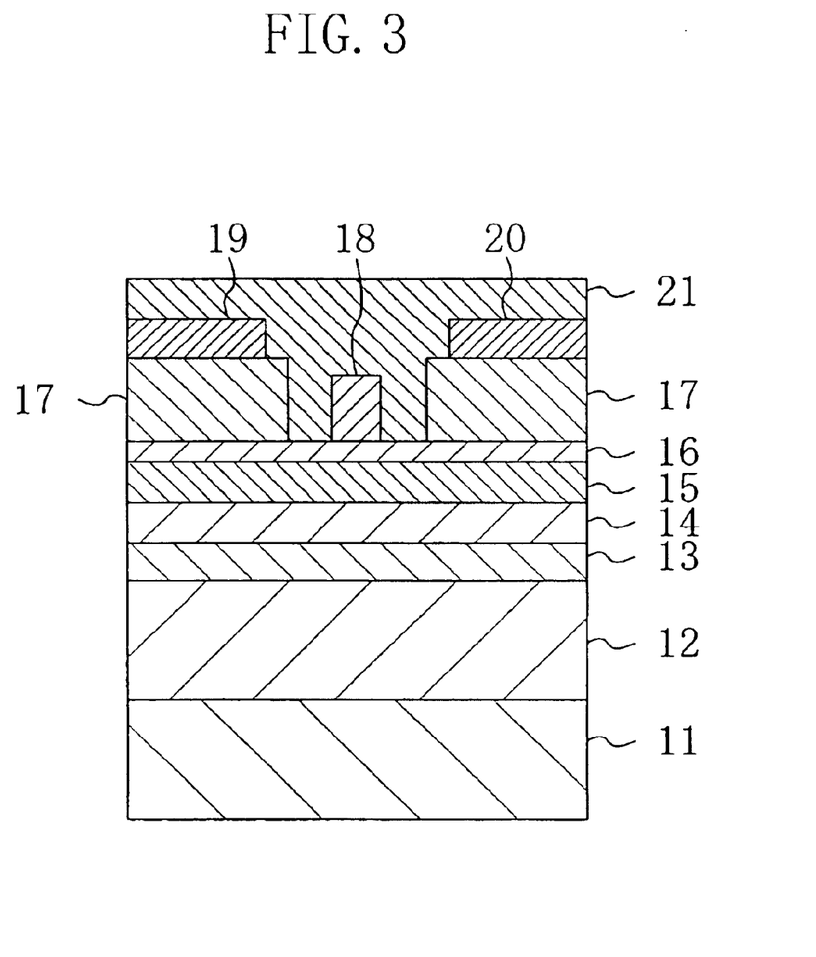
FIG. 3 is a structural cross sectional view showing a field-effect transistor according to a second embodiment of the present invention.

FIG. 3 shows the cross sectional structure of a field-effect transistor according to a second embodiment of the present invention. Referring to FIG. 3, the same numerals are given to the same members as in FIG. 1, and a description thereof is not given.

As shown in FIG. 3, a buffer layer 12, a barrier layer 13, a channel layer 14, a carrier supply layer 15, a Schottky layer 16, and a cap layer 107 are successively stacked on a compound semiconductor substrate 11. A gate electrode 18 is formed on a part of the Schottky layer 16 exposed at the recess opening of the cap layer 17 to serve as a Schottky electrode. Source and drain electrodes 19 and 20 are formed on the cap layer 17 placed to both sides of the gate electrode 18 to serve as ohmic electrodes.

A protective film 21 made of benzocyclobutene (BCB) is placed over the whole surface of the cap layer 17 including the top surfaces of the gate, source and drain electrodes 18, 19 and 20.

A material constituting the protective film 21 is not limited to BCB. There can be used low-dielectric-constant materials (so-called low-k materials), for example, SiLK (aromatic hydrocarbon polymer from the Dow Chemical Company), FSG (Fluorinated Silicate Glass), SOG (Spin on Glass) such as porous silicon or organic siloxane.

Typically, silicon nitride (SiN) with excellent moisture resistance is used as a material of the protective film 21 covering the Schottky layer 16. On the other hand, in the second embodiment, since the Schottky layer 16 is made of hard-to-oxidize InGaP, a moisture-resistant material does not have to be used thereas.

Therefore, according to the second embodiment, the reliability of the field-effect transistor does not decrease even without forming a SiN film on the Schottky layer 16. Thus, the protective film 21 can be formed of a low-dielectric-constant material having a smaller relative dielectric constant than SiN. As a result, the parasitic capacitance of the field-effect transistor can be reduced.

Furthermore, also in the second embodiment, the Schottky layer 16 is made of disordered InGaP and formed to have a thickness of 10 nm or less, as in the first embodiment. Therefore, there is realized a field-effect transistor in which the reverse breakdown voltage of the gate electrode 18 is improved as compared with the case where the gate electrode 18 is formed on the Schottky layer made of AlGaAs. Consequently, it becomes possible for a field-effect transistor using InGaP for the Schottky layer 16 to improve both the maximum current density and the gate breakdown voltage.

(Embodiment 3)

A third embodiment of the present invention will be described hereinafter with reference to the drawing.

Figure 4:
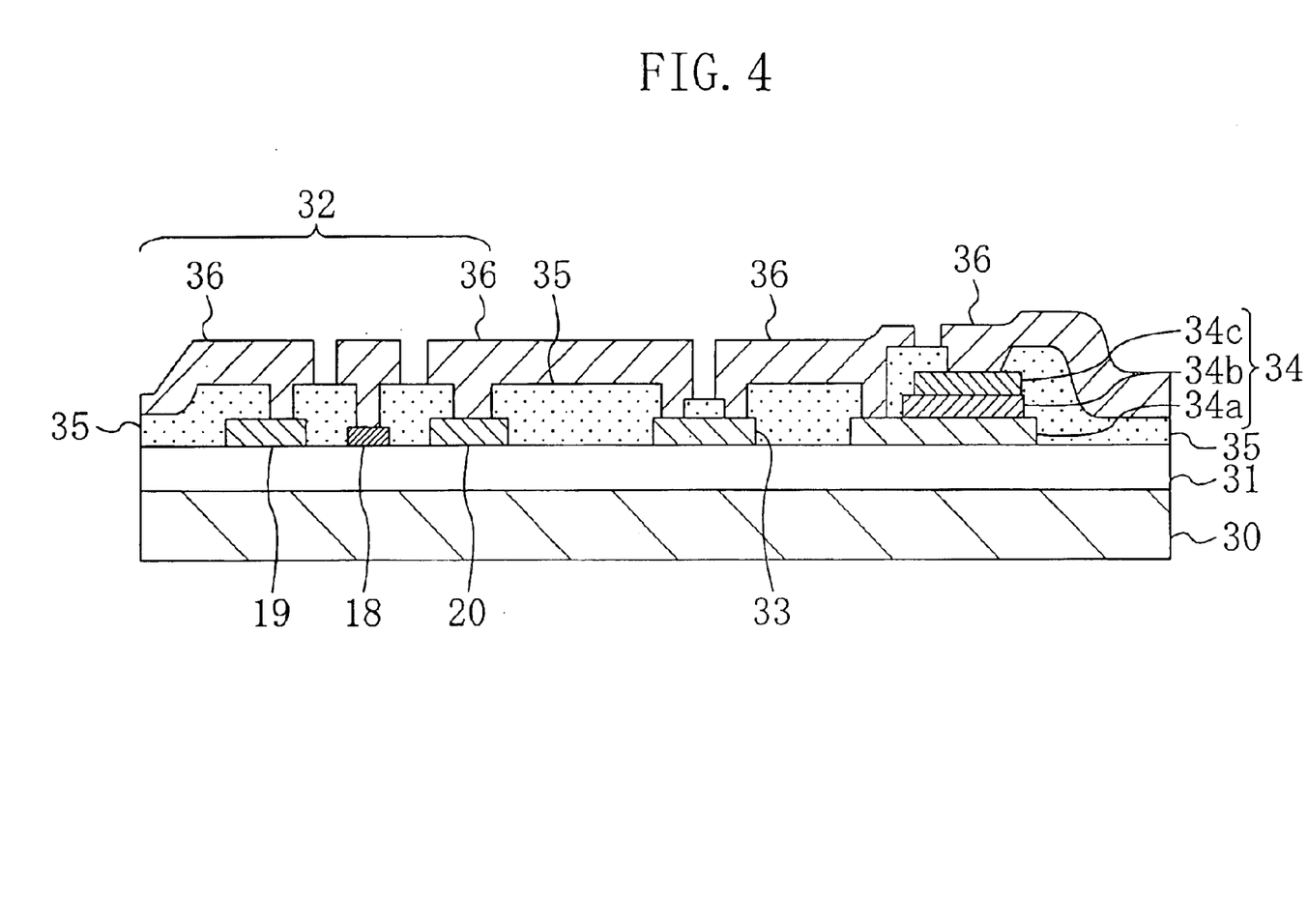
FIG. 4 is a structural cross sectional view showing an integrated circuit device according to a third embodiment of the present invention.

FIG. 4 shows the cross sectional structure of an integrated circuit according to a third embodiment of the present invention. As shown in FIG. 4, an epitaxial layer 31 made of a compound semiconductor is formed on a compound semiconductor substrate 30 made of, for example, GaAs by crystal growth.

In the region denoted by 32 on the substrate 30 and the epitaxial layer 31, a field-effect transistor is formed to have the same structure as that of the first embodiment. A resistive element 33 and a capacitive element 34 are integrated on the substrate 30, thereby constructing a monolithic microwave integrated circuit (MMIC).

The resistive element 33 is composed of, for example, polysilicon (PS), tungsten silicide nitride (WSiN) or nickel chrome (NiCr). In this case, WSiN or NiCr is in particular preferable. The capacitive element 34 is composed of, for example, a lower electrode 34a and an upper electrode 34c both made of platinum (Pt), and a capacitive dielectric film 34b made of, for example, silicon nitride (SiN) and interposed therebetween.

As shown in FIG. 4, the drain electrode 20 of the field-effect transistor 32 is electrically connected to one terminal of the resistive element 33 via a metal interconnect 36 formed on an interlevel dielectric 35. The other terminal of the resistive element 33 is electrically connected via the metal interconnect 36 to the lower electrode 34a of the capacitive element 34.

The field-effect transistor 32 can improve both the maximum current density and the gate breakdown voltage as described in the first embodiment. Therefore, it becomes possible to improve power characteristics determined by the product of the maximum current density and the breakdown voltage.

Accordingly, an MMIC integrating the field-effect transistor 32, resistive element 33 and capacitive element 34 can provide a switching circuit with excellent electrical characteristics.

It is needless to say that the integrated circuit of the third embodiment has excellent electrical characteristics even in the application thereof to a power amplifier.

(Embodiment 4)

A fourth embodiment of the present invention will be described hereinafter with reference to the drawing.

Figure 5:
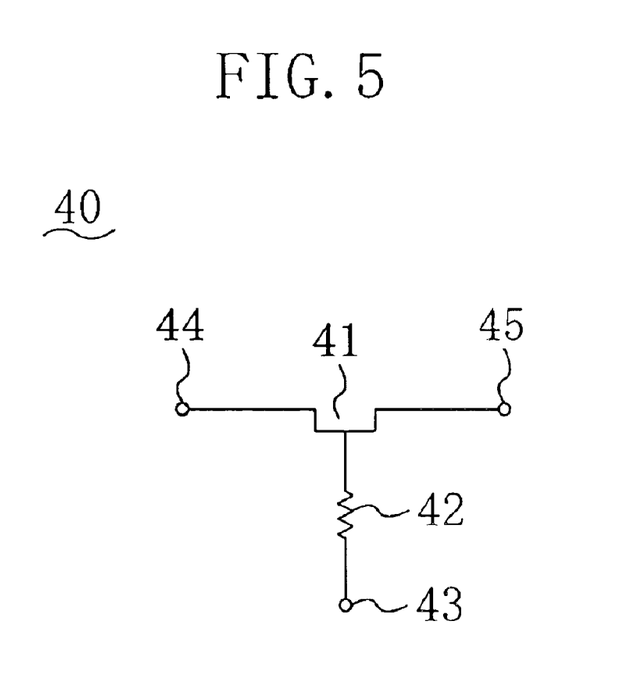
FIG. 5 is a circuit diagram showing a switching circuit according to a fourth embodiment of the present invention.

FIG. 5 shows the structure of a switching circuit according to a fourth embodiment of the present invention. As shown in FIG. 5, a switching circuit 40 is composed of a field-effect transistor 41 having the same structure as that of the first embodiment and a resistive element 42 connected to the gate electrode of the field-effect transistor.

The terminal of the resistive element 42 opposite to the gate electrode side is connected to a control terminal 43 to which a direct voltage (direct bias) is applied.

The source electrode of the field-effect transistor 40 is connected to an input terminal 44 for feeding an RF signal, while the drain electrode thereof is connected to an output terminal 45 thereof.

With this structure, as well known, if a higher control voltage than the threshold voltage $V_{th}$ set by the field-effect transistor 41 is applied to the control terminal 43, this allows an RF signal to be delivered from the input terminal 44 to the output terminal 45. On the other hand, if a lower control voltage than the threshold voltage $V_{th}$ is applied thereto, this does not allow the RF signal to be delivered from the input terminal 44.

In this case, the field-effect transistor 41 of the fourth embodiment includes disordered InGaP at least in the upper part of the Schottky layer, resulting in improved maximum current density. Therefore, the frequency dispersion of drain current can be suppressed. As a result, a switching failure (burst failure) can be restrained from occurring in turning a switch from an off state to an on state.

Furthermore, in order to increase the maximum power that is one of important characteristics of the switching circuit, it is significant to make the threshold voltage $V_{th}$ of the field-effect transistor 41 shallow (small in terms of an absolute value). In conventional techniques, however, a shallow threshold voltage $V_{th}$ causes a burst failure.

On the other hand, the use of the switching circuit 40 according to the fourth embodiment improves the gate breakdown voltage because in this case the thickness of disordered InGaP placed in the upper part of the Schottky layer is set at 8 nm or less. Hence, a burst failure can be certainly prevented even in the design of the field-effect transistor 41 having a shallow threshold voltage $V_{th}$. As a result, the switching circuit 40 can perform switching by using extremely large RF power.

(Modification of Embodiment 4)

A modification of a fourth embodiment of the present invention will be described hereinafter with reference to the drawing.

Figure 6:
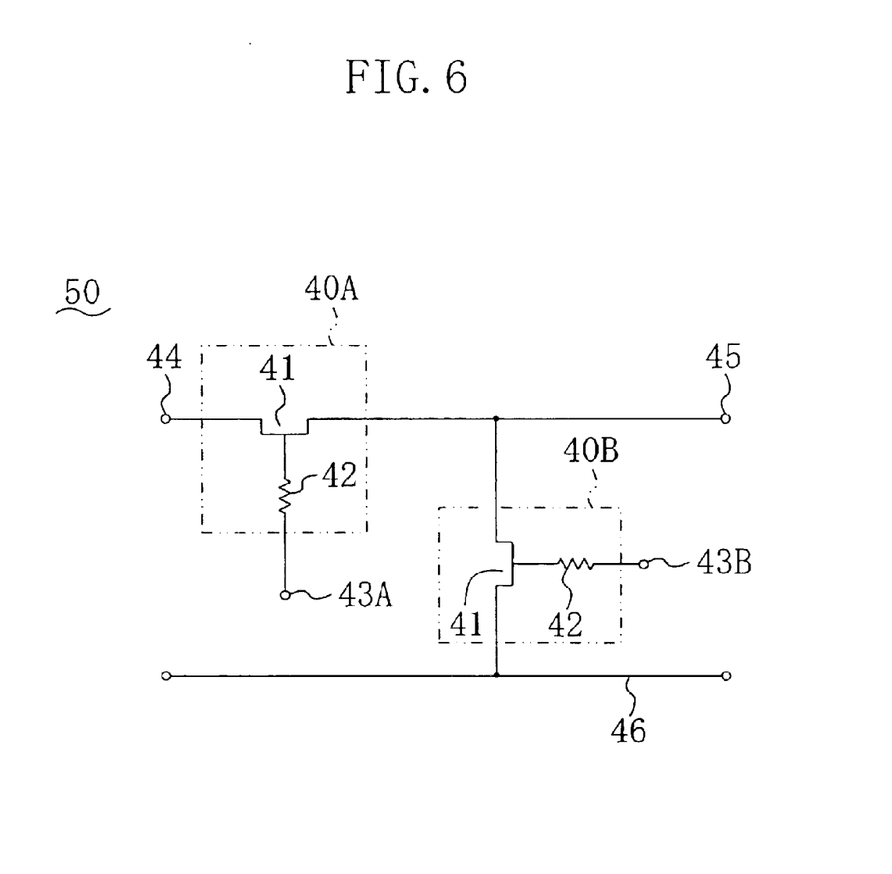
FIG. 6 is a circuit diagram showing a switching circuit according to a modification of the fourth embodiment of the present invention.

FIG. 6 shows the structure of a switching circuit according to a modification of a fourth embodiment of the present invention. Referring to FIG. 6, the same reference numerals are given to the same members as in FIG. 5 and a description thereof is not given. As shown in FIG. 5, a switching circuit 50 is composed of a first switching circuit 40A and a second switching circuit 40B. The second switching circuit 40B is shunt-connected between the output terminal 45 of the first switching circuit 40A and a ground 46.

In the switching circuit 50, if a higher control voltage than the threshold voltage $V_{th}$ of the field-effect transistor 42 is applied to a first control terminal 43A of the first switching circuit 40A and a lower control voltage than the threshold voltage $V_{th}$ of the field-effect transistor 42 is applied to a second control terminal 43B of the second switching circuit 40B, an RF signal fed to the input terminal 44 is transmitted to the output terminal 45. Thus, the switching circuit 50 turns on.

On the contrary, if a lower control voltage than the threshold voltage $V_{th}$ of the field-effect transistor 42 is applied to the first control terminal 43A of the first switching circuit 40A and a higher control voltage than the threshold voltage $V_{th}$ of the field-effect transistor 42 is applied to the second control terminal 43B of the second switching circuit 40B, an RF signal fed to the input terminal 44 is not transmitted to the output terminal 45. Thus, the switching circuit 50 turns off.

In this way, the field-effect transistor 41 having the same structure as that of the first embodiment is used to control the on/off state of the switching circuit 50 in accordance with the control voltage applied to each of the control terminals 43A and 43B. Therefore, a burst failure due to the frequency dispersion of the drain current can be prevented. Hence, a pair of field-effect transistors 41 can be certainly switched between the on state and the off state. As a result, very excellent switching characteristics can be achieved.

It is needless to say that the present invention is applicable to extremely various kinds of switching circuits, such as a so-called SPDT (Single-Pole Double-Throw) having one input port and two output ports or a DPDT (Double-Pole Double Throw) having two input ports and two output ports, which can be realized by connecting a plurality of switching circuits 40 described in the fourth embodiment to one another.

The field-effect transistor of the present invention, and the integrated circuit device and switching circuit using the same can improve the reverse breakdown voltage of the Schottky electrode, and further prevent a burst failure in the switching circuit by applying the field-effect transistor of the present invention to the switching circuit. Thus, they are useful in the fields of radio frequency communications equipment, switching circuits and the like.

What is claimed is:

1. A field-effect transistor comprising:
   a first compound semiconductor layer through which carriers travel;
   a second compound semiconductor layer for supplying carriers to the first compound semiconductor layer, said second compound semiconductor layer being formed on the first compound semiconductor layer;
   a third compound semiconductor layer formed on the second compound semiconductor layer; and a gate electrode forming a Schottky junction with the third compound semiconductor layer, said gate electrode being formed on the third compound semiconductor layer, wherein at least the upper part of the third compound semiconductor layer is made of indium gallium phosphate having a broken natural superlattice and a set thickness of a predetermined value or less.

2. The field-effect transistor of claim 1, wherein indium gallium phosphate placed in the third compound semiconductor layer has a thickness of 8 nm or less.

3. The field-effect transistor of claim 1, wherein when the indium gallium phosphate is placed only in the upper part of the third compound semiconductor layer, the lower part of the third compound semiconductor layer is made of aluminum gallium arsenide.

4. The field-effect transistor of claim 1, wherein the second compound semiconductor layer is made of aluminum gallium arsenide.

5. The field-effect transistor of claim 1, further comprising a protective film made of a low-dielectric-constant material, said protective film being formed to cover the gate electrode on the third compound semiconductor layer.

6. The field-effect transistor of claim 5, wherein the low-dielectric-constant material is benzocyclobutene.

7. An integrated circuit device obtained by forming, on a substrate, a field-effect transistor and a passive element electrically connected to the field-effect transistor, wherein the field-effect transistor comprises:

a first compound semiconductor layer through which carriers travel;

a second compound semiconductor layer for supplying carriers to the first compound semiconductor layer, said second compound semiconductor layer being formed on the first compound semiconductor layer;

a third compound semiconductor layer formed on the second compound semiconductor layer; and a gate electrode forming a Schottky junction with the third compound semiconductor layer, said gate electrode being formed on the third compound semiconductor layer, wherein at least the upper part of the third compound semiconductor layer is made of indium gallium phosphate having a broken natural superlattice and a set thickness of a predetermined value or less.

8. A switching circuit comprising a field-effect transistor including gate, drain and source electrodes, said drain and source electrodes serving as input and output terminals, and a resistive element connected at one end to the gate electrode and serving as a control terminal at the other end, wherein the field-effect transistor comprises:

a first compound semiconductor layer through which carriers travel;

a second compound semiconductor layer for supplying carriers to the first compound semiconductor layer, said second compound semiconductor layer being formed on the first compound semiconductor layer;

a third compound semiconductor layer formed on the second compound semiconductor layer; and a gate electrode forming a Schottky junction with the third compound semiconductor layer, said gate electrode being formed on the third compound semiconductor layer, wherein at least the upper part of the third compound semiconductor layer is made of indium gallium phosphate having a broken natural superlattice and a set thickness of a predetermined value or less.

9. A plurality of switching circuits each comprising: a field-effect transistor including gate, drain and source electrodes, said drain and source electrodes serving as input and output terminals; and a resistive element connected at one end to the gate electrode and serving as a control terminal at the other end, said plurality of switching circuits being electrically connected to one another, wherein each field-effect transistor comprises:

a first compound semiconductor layer through which carriers travel;

a second compound semiconductor layer for supplying carriers to the first compound semiconductor layer, said second compound semiconductor layer being formed on the first compound semiconductor layer;

a third compound semiconductor layer formed on the second compound semiconductor layer; and a gate electrode forming a Schottky junction with the third compound semiconductor layer, said gate electrode being formed on the third compound semiconductor layer, wherein at least the upper part of the third compound semiconductor layer is made of indium gallium phosphate having a broken natural superlattice and a set thickness of a predetermined value or less.

* * * * *